United States Patent [19]

Bahraman

[11] Patent Number: 5,325,106
[45] Date of Patent: Jun. 28, 1994

[54] ANALOG DRIVER FOR SCROLLABLE SPATIAL LIGHT MODULATOR

[75] Inventor: Ali Bahraman, Palos Verdes Estates, Calif.

[73] Assignee: Northrop Corporation, Los Angeles, Calif.

[21] Appl. No.: 828,545

[22] Filed: Jan. 27, 1992

[51] Int. Cl.$^5$ .............................................. G09G 3/26
[52] U.S. Cl. ...................................... 345/56; 345/89
[58] Field of Search ............. 340/783, 768, 792, 719, 340/784, 767, 793, 359, 358; 359/59, 57, 55, 85; 358/213.23, 213.25, 213.26; 345/56, 59, 147, 84, 89, 63, 123

[56] References Cited

U.S. PATENT DOCUMENTS

| | | | |
|---|---|---|---|
| 3,651,493 | 3/1972 | Ngo | 340/768 |
| 4,051,409 | 9/1977 | Graycraft | 340/763 |
| 4,104,626 | 8/1978 | Ngo | 340/324 M |
| 4,109,181 | 8/1978 | Murase et al. | 315/169 TV |
| 4,114,069 | 9/1978 | Yamaguchi et al. | 315/169 TV |
| 4,147,960 | 4/1979 | Andoh et al. | 340/769 |
| 4,239,346 | 12/1980 | Lloyd | 340/719 |
| 4,247,802 | 1/1981 | Kurokawa | 315/169.2 |
| 4,328,489 | 5/1982 | Ngo | 340/713 |
| 4,386,351 | 5/1983 | Lowdenslager | 340/768 |
| 4,518,959 | 5/1985 | Ueda et al. | 340/784 |
| 4,815,035 | 3/1989 | Brooks | 365/108 |
| 4,870,396 | 9/1989 | Shields | 340/784 |

OTHER PUBLICATIONS

Cotter et al "Ferroelectric-Liquid-Crystal/Silicon-integrated-circuit Spatial Light Modulator" pp. 291-293, 1990.

McKnight et al "Development of a spatial light modulator: a randomly addressed Liquid-Crystal-Over-n-MOS Array" pp. 4757-4762, Nov. 1989.

Sunlin Chou, "Design of a 16 384-Bit Serial Charge-Coupled Memory Device" IEEE Journal of Solid-State Circuits vol. Sc-11 No. 1 Feb. 1976, pp. 10-12.

Primary Examiner—Alvin E. Oberley
Assistant Examiner—Regina Liang
Attorney, Agent, or Firm—Terry J. Anderson; Robert B. Block; Karl J. Hoch, Jr.

[57] ABSTRACT

A scrollable spatial light modulator—or SLM—provides non-destructively transfer and display of an analog signal, which may include multiple levels of gray scale information, for high speed analog optical processing. Each pixel in the scrollable SLM consists of a metal-oxide-semiconductor—or MOS—transistor and four MOS capacitors in a four-phase charge-coupled device—or CCD—array. Two of the MOS capacitors in each pixel are used for charge storage while the other two are used to implement charge transfer. An MOS transistor used to control the gate of one of the charge storage MOS capacitors is clocked to float only when the charge signal is being stored therein and then drives a pixel of the liquid crystal display, such as a ferroelectric liquid crystal display to encode a frame of data onto a light beam as an image.

13 Claims, 3 Drawing Sheets

ANALOG DRIVER FOR SCROLLABLE SPATIAL LIGHT MODULATOR

BACKGROUND OF THE INVENTION

1. Field of the Invention

This invention relates to optical information processing devices, such as spatial light modulators—or SLMs—and, in particular, relates to two-dimensional ferroelectric liquid crystal—or FLC—SLM arrays used for encoding a frame of data onto a light beam as an image.

2. Description of the Prior Art

FLC SLMs have received considerable attention recently for optical processing applications. For example, a two dimensional SLM arrays can encode a frame of data onto a light beam as an image. Very high computational speeds can be achieved by the successive parallel processing of each image frame. To modulate the FLC, it must be driven or addressed by an appropriate driver circuit, such as a silicon driver circuit. In a conventional configuration, a light modulating FLC layer is directly mounted on top of a silicon integrated circuit chip containing the drive circuitry. Configurations of this type have been described by Cutter et al. "Ferroelectric-Liquid-Crystal/Silicon-IC Spatial Light Modulator Optics Letters", Optics Vol 15, 291 (March 1990) and by McKnight et al , "Development of Spatial Light Modulator: A Randomly Addressed Liquid-Crystal-over-NMOS Array" Applied Optics, Vol 28, 4757 (Nov. 1989).

What is needed, however, are techniques for providing scrollable SLMs—particularly scrollable FLC SLMs—in which the driver is able to scroll the data to be displayed, for example, from left to right, or in any other desired direction, nondestructively. The driver circuitry for the desired scrollable SLM must therefore perform two basic functions. The drive circuitry must provide for the transfer of the information to be displayed along the line of motion, that is, the transfer of the signal from pixel to pixel. In addition, the desired drive circuitry must provide for the non-destructive sensing or analog readout of the information to be displayed at each pixel. Both operations should be performed without loss of signal to avoid image degradation and without any need to refresh the information.

SUMMARY OF THE INVENTION

The preceding and other shortcomings of the prior art are addressed and overcome by the present invention in which, in a first aspect, provides a scrollable SLM row or matrix of pixels capable of non-destructively transferring and displaying an analog signal, which may include multiple levels of gray scale information, thus enabling high speed analog optical processing. Each pixel in the scrollable SLM consists of a metal-oxide-semiconductor or MOS—transistor and four MOS capacitors in a four-phase charge-coupled device—or CCD—array. Two of the MOS capacitors in each pixel are used for charge storage while the other two are used to implement charge transfer. The MOS transistor is used to control the gate of one of the charge storage MOS capacitors to permit non-destructive readout of the charge information stored therein.

In a further aspect, the present invention provides a scrollable spatial light modulator having a row of light modulating pixels, a signal to be scrolled along the row of pixels, first storage means associated with each pixel, second storage means associated with each pixel, means for non-destructively transferring the signal from the first storage means of one pixel to the second storage means of the same pixel and then to the first storage means of an adjacent pixel in the row, and means for non-destructively, optically modulating each pixel in accordance with the signal stored in the second storage means associated with that pixel.

In a further aspect, the present invention provides a scrollable spatial light modulator including a matrix of light modulating pixels organized in rows and columns, a charge signal associated with the first pixel in each row to be scrolled along that row, first and second MOS charge storage—and first and second MOS charge transfer—capacitors associated with each pixel, means for simultaneously, non-destructively transferring the charge signals from the first charge storage capacitor of each pixel in a first column to the second charge storage capacitor of that pixel via one of the charge transfer capacitors in that pixel and then to the first storage charge capacitor of a pixel in the same row in an adjacent column via another charge transfer capacitor, and means for non-destructively optically modulating each pixel in accordance with the charge signal stored in the second storage capacitor associated with that pixel. The means for non-destructively optically modulating each pixel may include a MOS transistor associated with the second charge storage capacitor of each pixel, means for permitting a signal associated with each MOS transistor to vary while a charge signal is being transferred to the associated second charge storage capacitor, and means for modulating each pixel in accordance with the signal associated with the corresponding transistor.

These and other features and advantages of this invention will become further apparent from the detailed description that follows which is accompanied by drawing figures. In the figures and description, numerals indicate the various features of the invention, like numerals referring to like features throughout both the figures and the description.

DETAILED DESCRIPTION OF THE PREFERRED EMBODIMENTS

Figure 1:
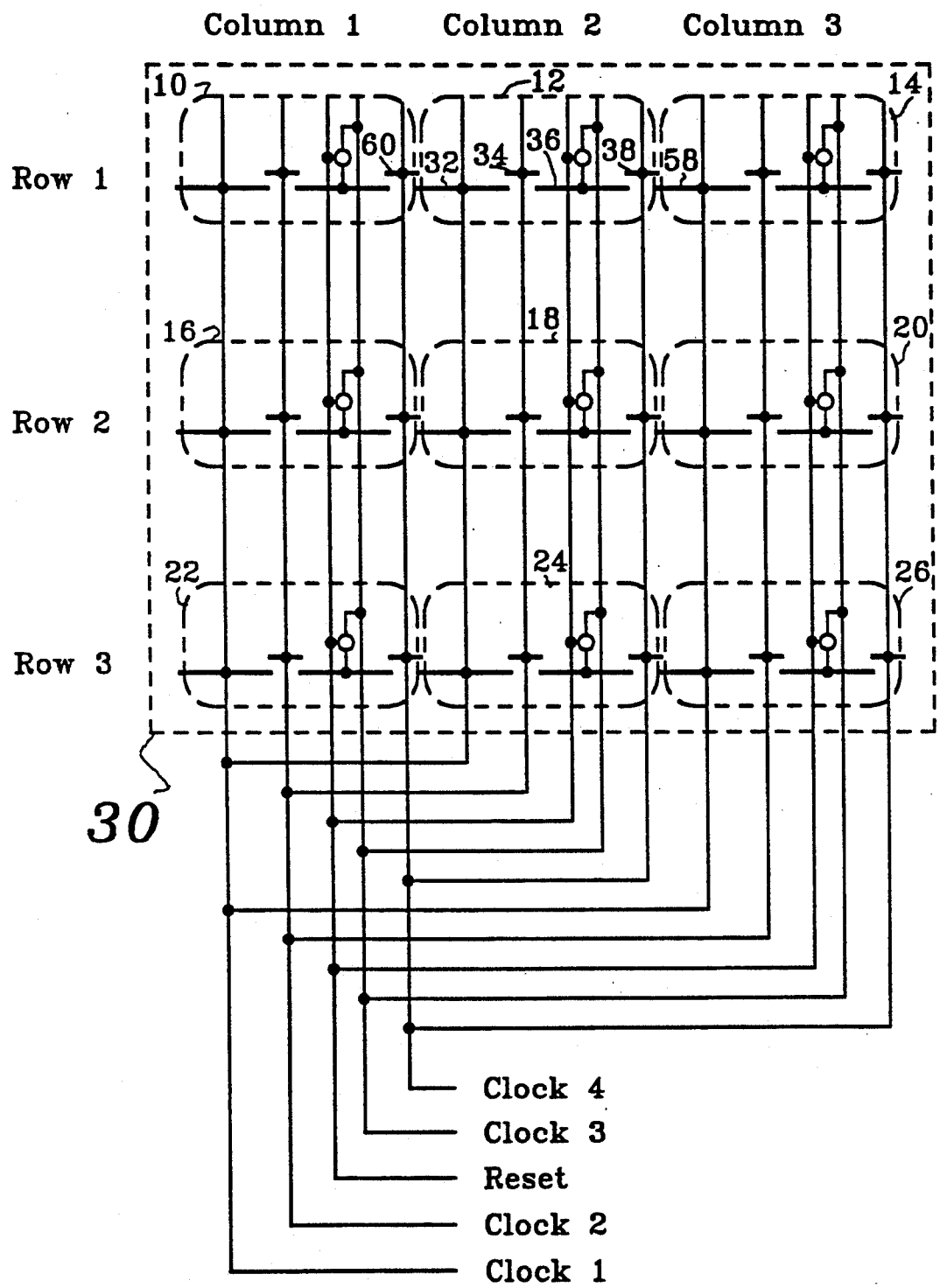
FIG. 1 is a schematic diagram of a two dimensional 3×3 scrollable SLM array configured according to the present invention.

FIG. 1 is a schematic diagram of a two dimensional 3×3 scrollable SLM array, SSLM 30, configured according to the present invention. SSLM 30 has three rows and three columns each of individual pixels. The first row includes pixels 10, 12, and 14. The second row includes pixels 16, 18, and 20 while the third row includes pixels 22, 24, and 26. For convenience, SSLM 30 will be shown to scroll from left to right, that is, the charge or information packets residing in pixels 10, 16, and 22 of Column 1 will be transferred, each packet within the same row, to pixels 12, 18, and 24 of Column 2, respectively and from there to Column 3 which includes pixels 14, 20, and 26. Although a square matrix of 3 rows and 3 columns has been shown for illustration, a scrollable SLM according to the present invention may be of any size consistent with the available construction techniques for SLM's.

Each pixel of SSLM 30 may include an individual light modulating device, such as a liquid crystal display—or LCD—and, in a preferred embodiment of the present invention would include a ferroelectric liquid crystal—or FLC—device. In operation of SSLM 30, each FLC—one of which is shown in FIGS. 2A-D as FLC 28—will modulate light in accordance with the signal or charge level in the corresponding pixel, such as pixel 12. The array of such individual pixel light modulators becomes a spatial light modulator useful for optical image processing. In SSLM 30 the analog charge level in each pixel is transferred in a non-destructive analog fashion from one pixel to another so that the image processed by the two dimensional scrollable SLM array may be defined with gray scale resolution rather than binary resolution as provided by digital SLMs. That is, the charge information in each pixel may represent one of many different levels of gray, such as 8 levels of gray, rather than only opaque and transparent as would be represented in a digital SLM.

The operation of SSLM 30 with regard to the scrolling of the charges along the pixels will be described with reference to FIG. 1 followed by a description of the operation of an individual pixel, pixel 12, with reference to FIGS. 2A-2D. The descriptions of both SSLM 30 in FIG. 1 and pixel 12 in FIGS. 2A-2D may be more clearly understood with reference to the timing diagrams of the clock and reset lines shown in FIG. 3. A physical implementation of an individual pixel, such as pixel 12, is shown in cross-sectional view in FIG. 4.

Figure 2A:
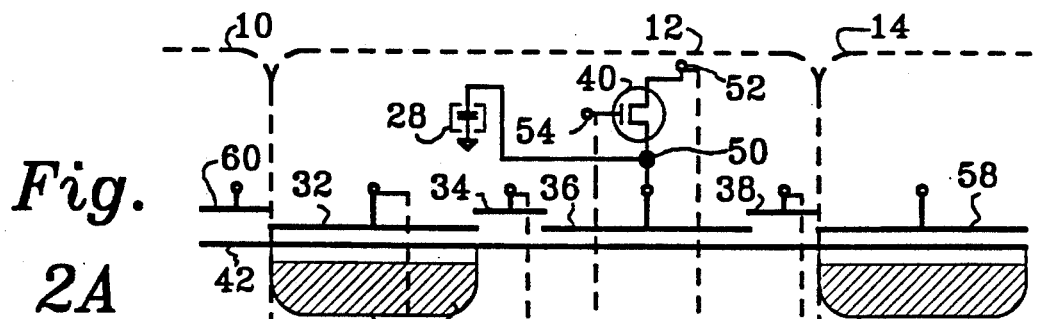
FIGS. 2A–2D are a series of functional diagrams of the stages of operation of a portion surrounding a single pixel of a scrollable SLM according to the present invention.

As shown in detail for example in FIG. 2A, each pixel includes four MOS capacitors, such as capacitors 32, 34, 36, and 38 of pixel 12. The four capacitors in each such pixel are configured in a manner similar to a conventional four-phase, charge-coupled device—or CCD—in that the first and third capacitors are used for charge storage operations while the second and fourth capacitors are used for charge transfer operations, The third capacitor, that is, the second charge storage capacitor is also used for sensing and display in conjunction with FLC 28 as will be described below in greater detail with reference to FIGS. 2A-2D.

The pixel may also be configured so that the first capacitor is used for charge transfer rather than a charge storage operation. In this alternate configuration, the first and third capacitors would be used for charge transfer while the second and fourth capacitors would be used for charge storage operations. The fourth capacitor, that is, the second charge storage capacitor would be used for sensing and display in conjunction with FLC 28.

In the configuration shown in FIGS. 2A-2D in which the first and third capacitors are used for charge storage operations, the first storage capacitor in each pixel, such as first charge storage MOS capacitor 32 in pixel 12, is driven by the first gate or clock line shown in the figures as Clock 1 or C1. The first transfer capacitor in each pixel, that is, the second capacitor—such as first charge transfer MOS capacitor 34 of pixel 12—is driven by Clock 2 or C2. The second charge storage capacitor, that is, the third capacitor—such as second charge storage MOS capacitor 36 in pixel 12—is driven by Clock 3 while the second transfer capacitor, that is, the fourth capacitor—such as second charge transfer MOS capacitor 38—is driven by Clock 4 also shown as C4. As will be described below in greater detail, Clock 3 is applied to the second charge storage capacitor through the MOS transistor associated with each pixel, such as MOS transistor 40 of pixel 12. Each such MOS transistor controls the operation of the FLC associated with that pixel, such as FLC 28 associated with pixel 12. A reset clock line, shown in the figures as Reset or R is also applied to each such MOS transistor.

In scrolling operation of SSLM 30, an appropriate analog charge or signal is introduced into the first charge storage MOS capacitor in each pixel in Column 1 by conventional means, such as by diode loading. The proper sequential activation of Clocks 1-4, and Reset, as described below in greater detail, causes the charge in each pixel to be non-destructively transferred to the second charge storage MOS capacitor in the same pixel where the value of the charge is non-destructively sensed and the resulting voltage applied to the corresponding FLC. At the end of this cycle of operation, the charge is non-destructively transferred to the first charge storage MOS capacitor of the next pixel, that is, the pixel in Column 2. Throughout this cycle, the charge has been transferred and sensed and displayed by the FLC non-destructively, that is, the analog value of the charge applied to the pixel in Column 1 has not been changed by either the transfer or sense and display operations so that the value of the charge applied to the first column will be the same when displayed by each of the pixels through which it is scrolled. A charge transfer efficiency of about 0.99995 or better is available with current CCDs.

Referring now to FIGS. 2A-2D, the operation of pixel 12 during a particular transfer and display cycle will be described in greater detail. Each of the capacitors in each pixel are formed on the surface of silicon crystal substrate, represented in FIGS. 2A-2D as substrate surface 42. In accordance with conventional CCD configurations, and conventional MOS technology, the volume of the silicon substrate immediately below each capacitor electrode shown may be driven into depletion by the application of an appropriate voltage to create a potential well. The potential wells associated with each charge storage MOS capacitor is able to contain a charge, if a charge is applied thereto. The potential wells associated with each charge transfer MOS capacitor are used to cause a charge transfer between the potential wells associated with the charge storage MOS capacitors on either side of the charge transfer capacitor. The direction of the charge transfer—from the first charge storage capacitor past the charge transfer capacitor to the second charge storage capacitor—is controlled by the timing of the application of the clock line signals to each such MOS capacitor as will be described with reference to FIG. 3.

Figure 3:
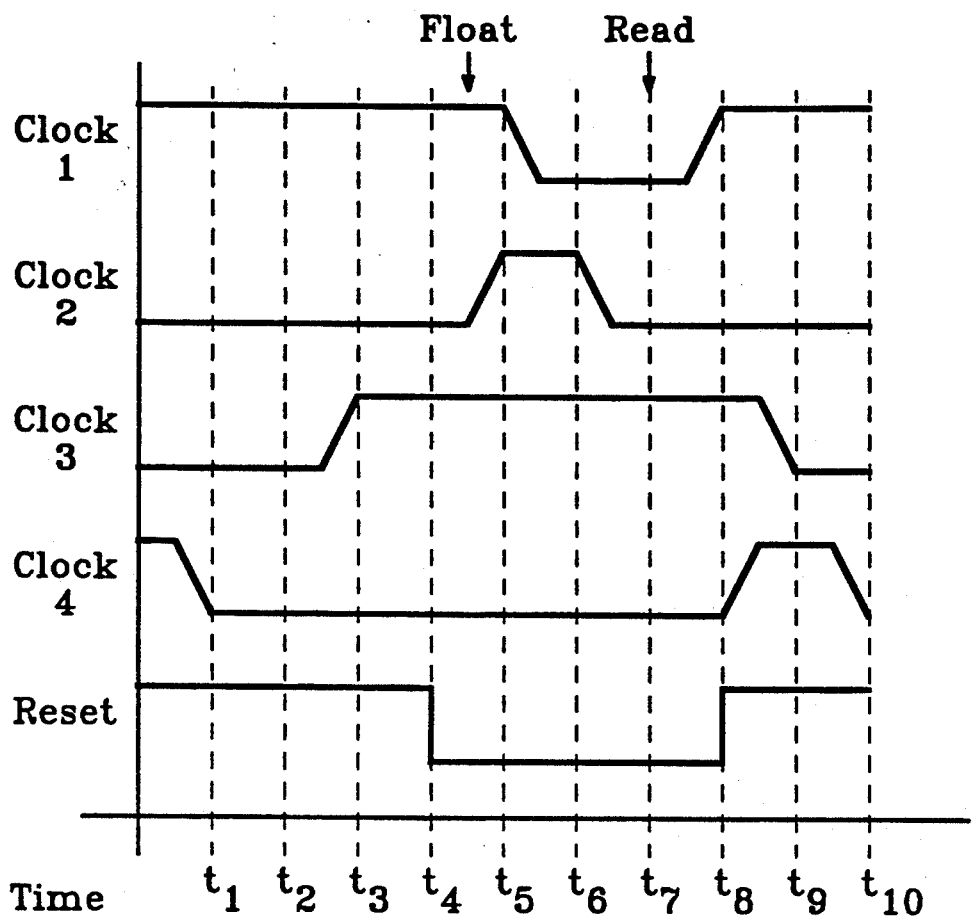
FIG. 3 is a series of timing diagrams of the clock and reset lines of the scrollable SLMs shown in FIGS. 1 and FIGS. 2A–2D.

Referring now to FIG. 2A, the initialization of the cycle to be described has occurred by time period $t_1$—shown in FIG. 3—at which time the first charge storage MOS capacitor 32 has been biased by Clock 1 to create potential well 44 in which charge 46 is stored. Charge 46 would have been transferred to potential well 44 from pixel 10 before the beginning of the scrolling cycle being described. First charge transfer MOS capacitor 34 and second charge storage MOS capacitor 36 are biased at flat band, that is, there are no potential wells created thereunder because Clock 2 and Clock 3 are low. If charge 46 is the first charge being scrolled across SSLM 30, second charge transfer MOS capacitor 38 may also be biased at flat band. However, in the normal operation of SSLM 30, all clock lines to all pixels are operated synchronously so that Clock 4 would be high at time period $t_1$ to apply a bias to second charge transfer MOS capacitor 38 at the same time this same bias was applied to the second transfer capacitor of all pixels. The operation of second charge transfer MOS capacitor 38 by Clock 4 will be described below at the end the cycle being described with reference to the transfer of charge 46 from pixel 12 to pixel 14. In any event, Clock 4 goes low to drive second charge transfer MOS capacitor 38 to flat band during time period $t_2$. The reset clock line shown as Reset or R is normally held high, except as otherwise noted.

Figure 2B:
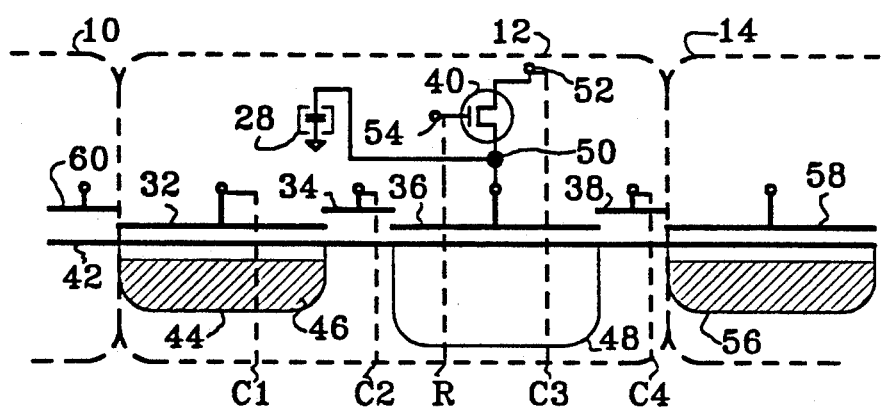

Referring now to FIG. 2B, second charge storage MOS capacitor 36 is driven into deep depletion at time period $t_3$ when Clock 3—which is applied to drain 52 of MOS transistor 40—goes high. Gate 54 of MOS transistor 40 is connected to Reset while source 50 of MOS transistor 40 is connected to second charge storage MOS capacitor 36 as well as to FLC 28. When Clock 3 drives the drain of MOS transistor 40 high while Reset is high, second charge storage MOS capacitor 36 is driven into deep depletion to create deep potential well 48. The other clock lines have not changed so that charge 46 remains in potential well 44 associated with first charge storage MOS capacitor 32.

Figure 2C:
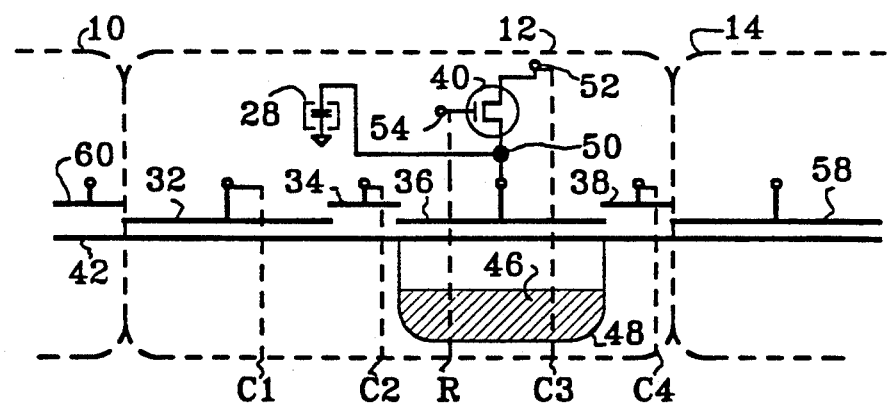

Referring now to FIG. 2C, Reset goes low at time period $t_4$ which allows second charge storage MOS capacitor 36 to float. That is, deep potential well 48 remains associated with second charge storage MOS capacitor 36, but the voltage at gate 54 has been removed so that the voltage at source 50 is allowed 25 to vary or float in accordance with the magnitude of the charge being transferred to second charge storage MOS capacitor 36— that is, source 50 is no longer clamped to a fixed voltage. During time period $t_5$ Clock 2 rises, creating a small potential well under first charge transfer MOS capacitor 34. During time period $t_6$, while Clock 2 is still high, Clock 1 goes low, collapsing potential well 44 under first charge storage MOS capacitor 32. As a result of the small potential well created by Clock 2 under first charge transfer MOS capacitor 34, charge 46 migrates past first charge transfer MOS capacitor to the deeper potential well, deep potential well 48, created under second charge storage MOS capacitor 36 by Clock 3. At time period $t_7$, the small potential well under first charge transfer MOS capacitor 34 is collapsed when Clock 2 goes low, resulting in the configuration shown in FIG. 2C in which charge 46 is stored in deep potential well 48 associated with second charge storage MOS capacitor 36 while the other MOS capacitors are biased at flat band.

It is important to note that Reset is low at time period $t_7$ so that source 50 is floating when charge 46 is transferred into deep potential well 48. The transfer of charge into potential well 48 causes the potential at source 50 to change to a value proportional to the magnitude of charge 46. Until Reset goes high again, the potential—that is the voltage—at source 50 is maintained at the value corresponding to the magnitude of charge 46. Source 50 drives FLC 28, the other terminal of which is connected to ground. The voltage applied to FLC 28, and therefore the optical value of the information displayed by pixel 12, is then related to the magnitude of charge 46. This permits the sensing and display of analog values and therefore, for example, the sensing and display of multiple levels of gray rather than only dark and light or transparent as would be possible with a conventional digital system.

It is also important to note that the sensing and display of the analog value by pixel 12 results from a non-destructive readout of the value of charge 46. That is, the magnitude of charge 46 was not changed when charge 46 was transferred into deep potential well 48 which caused the voltage at source 50 to change to a value representing that charge. This non-destructive readout permits the signal or information being scrolled to be scrolled without requiring refreshing of the magnitude of the value represented thereby. The transfer of charge 46 within pixel 12 has also been a non-destructive transfer in that the transfers have occurred without change in the magnitude of charge 46. The completion of the cycle, described immediately below, will also be done non-destructively.

Figure 2D:
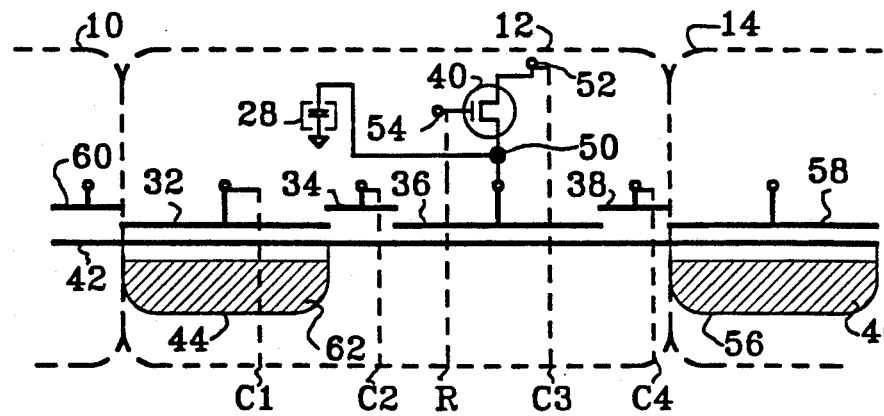

Referring now to FIG. 2D, as illustrated in FIG. 3 Clock 1 goes high at time period $t_8$ substantially simultaneously with the transition of Reset. As noted above with respect to the initiation of the cycle of transfer, when Clock 1 goes high, potential well 44 is created under first charge storage MOS capacitor 32 in pixel 12. As also noted above with respect to FIG. 1, the clock and reset lines are applied simultaneously to all pixels in SSLM 30. When Clock 1 goes high in time period $t_8$, potential well 56 is created under first charge storage MOS capacitor 58 in pixel 14.

Within time period $t_8$, Clock 4 goes high creating a small transfer potential well associated with second charge transfer MOS capacitor 38 in pixel 12. Clock 4 also creates a small transfer potential well associated with the second charge transfer MOS capacitor of all other pixels in SSLM 30 including second charge transfer MOS capacitor 60 of pixel 10. Immediately thereafter, during time period $t_9$, Clock 3 goes low collapsing deep potential well 48 and causing charge 46 to transfer past second charge transfer MOS capacitor 38 to potential well 56 associated with first charge storage MOS capacitor 58 of pixel 14. Similarly, the collapse of the deep potential well associated with the second charge storage MOS capacitor in pixel 10 caused when Clock 3 goes low in time period $t_9$, results in charge 62 being transferred past second charge transfer MOS capacitor 60 in pixel 10 to potential well 44 associated with first charge storage MOS capacitor 32 of pixel 12. This completes the scrolling cycle, returning the clock and reset lines to the initial conditions indicated above with respect to time period $t_1$.

In summary, SSLM 30 therefore operates to transfer an analog signal charge from one pixel to another non-destructively, in the time from time period $t_1$ to time period $t_{10}$. During time period $t_4$, second charge storage MOS capacitor 36 is caused to float so that at time period $t_7$ the analog value of the magnitude of the charge being transferred is read and applied to FLC 28 for display.

Figure 4:
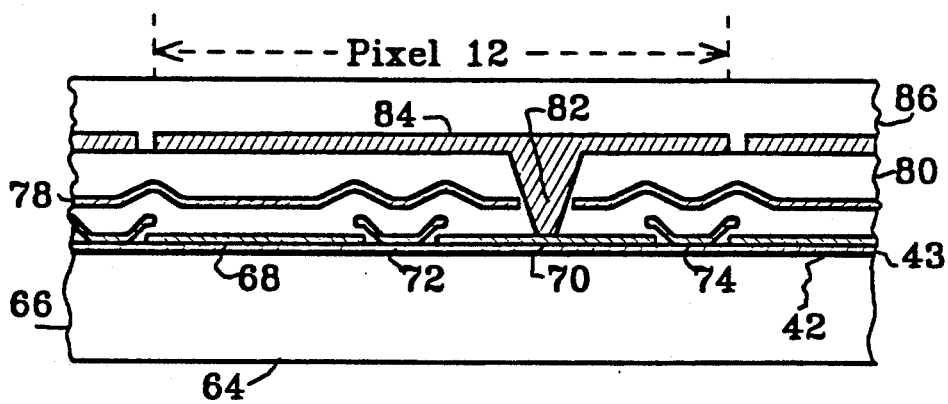
FIG. 4 is a partial cross-sectional view of a preferred implementation of the driver circuit of the scrollable SLM of the present invention.

Referring now to FIG. 4, the physical implementation of array segment 66 of a preferred embodiment of SSLM 30 surrounding a single pixel, such as pixel 12, is shown in cross-sectional view. SSLM 30 may be fabricated using conventional CCD and MOS techniques including buried channel or surface channel MOS capacitors.

The clock lines may be formed by two layers of polysilicon on gate oxide 43 on substrate surface 42 of silicon substrate 64 to form the MOS capacitors. Isolation between adjacent rows in silicon substrate 64 may be implemented in a conventional manner by doing a channel-stop ion implantation and growing a field oxide layer between the rows as is done with conventional CCD fabrication.

In particular, clock line 68 and display capacitor rectangle 70 may be patterned in a first layer of polysilicon formed on gate oxide 43 on substrate surface 42. Line 68 provides a common connection between all pixels in a particular column, such as Column 2, for Clock 1 while forming one common electrode of all first charge storage MOS capacitors in that column, such as first charge storage MOS capacitor 32. The other electrode of each such capacitor is formed by silicon substrate 64 under each pixel which is isolated from adjacent pixels as discussed above. First charge storage MOS capacitor 32 is therefore formed by the intersection of line 68 and Row 1.

Display capacitor rectangle 70 is patterned to be isolated in each row and therefore does not carry the signal for Clock 3. Each second charge storage MOS capacitor is formed at the location in a particular row of the display capacitor rectangle in that row. In particular, second charge storage MOS capacitor 36 in each pixel is formed by display capacitor rectangle 70 and silicon substrate 64 between the isolation regions described above.

After depositing or growing an appropriate layer of oxide for isolating the patterned first layer of polysilicon, a second level of polysilicon may be formed on gate oxide 43 on substrate surface 42 and patterned to form lines 72 and 74. Line 72 carries the signal for Clock 2 in Column 2 and forms first charge transfer MOS capacitor 34 at its intersection with Row 1, while line 74 carries the signal for Clock 4 in Column 2 and forms second charge transfer MOS capacitor 38 at its intersection with Row 1.

Thereafter a first layer of metalization may be deposited to form shield 78, for the MOS capacitors, on which a layer of polyimide or low temperature oxide may be formed on shield 78 as dielectric layer 80. Clock line 3, not shown in this figure, may also be formed on this layer. Alternatively, Clock line 3 may be formed by a second layer of metalization in a three level metalization process. Metalized vias, such as via 82, are formed through dielectric layer 80. A top layer of metalization is then deposited and patterned to form metal line 84 which provides a connection to display capacitor rectangle 70 which forms second charge storage MOS capacitors such as capacitor 36.

The top layer of metalization, which includes metal line 84, forms the base of conventional FLC layer 86 including an optically transparent electrode, such as Indium-Tin-Oxide. If necessary, the top layer of metalization may be planarized to provide a good contact for FLC layer 86. The MOS transistor for each pixel may be formed in a third layer of polysilicon in any convenient location and connected to Reset, not shown. Connections for Reset and Clock 3 may be routed horizontally along the rows if desired.

FLC 28 is a capacitive element and, if FLC 28 presents too high a capacitive loading to MOS transistor 40, an amplifier may be added for each pixel to drive the FLC load. FLC capacitive loading is about 5 nanofarads per square centimeter. Assuming an FLC pixel area of about 20 $\mu$m on a side, the capacitance would be on the order of 0.02 pico-farads indicating that the capacitive loading would not be high enough to require amplifiers for each pixel.

Charge transfer to pixels in Column 1 may be implemented in the conventional manner employed with CCDs in which a diode and an input transfer gate are used as described for example by G. S. Hobson, *Charge-Transfer Devices*, Edward Arnold Publishers Ltd., London, 1978, pp. 104–105 and 51. Two convenient approaches are available for clearing SSLM 30. In accordance with the first approach, the input transfer gate referenced above may be kept in the off state until the charges are all transferred horizontally to a diode reset node at the end of each row. This approach is similar to the approach used with conventional CCDs. In accordance with the alternate approach for clearing SSLM 30, all first or second charge storage MOS capacitors could be driven into strong accumulation. The strong accumulation will bring forth majority carriers to recombine with the stored minority carriers providing a very short reset time.

While this invention has been described with reference to its presently preferred embodiment(s), its scope is not limited thereto. Rather, such scope is only limited insofar as defined by the following set of claims and all equivalents thereof.

What is claimed is:

1. A scrollable spatial light modulator, comprising:
   a row of light modulating pixels;
   a signal to be scrolled along the row of pixels;
   first storage means comprising an MOS capacitor associated with each pixel;
   second storage means comprising an MOS capacitor associated with each pixel;
   a display element connected to said second storage means;
   means for non-destructively transferring the signal from the first storage means of one pixel to the second storage means of the same pixel and then to the first storage means of an adjacent pixel in the row; and
   mean for non-destructively modulating each display element in accordance with the signal stored in the second storage means associated with the pixel;
   said means for non-destructively transferring the signal further comprises:
   an MOS charge transfer capacitor between the first and second storage means associated with each pixel;
   an MOS charge transfer capacitor between the first or second storage means associated with each pixel and a first or second storage means associated with the adjacent pixel; and
   clock means for creating a storage potential well associated with each storage means before the signal is transferred thereto, for collapsing the storage potential well associated with each storage means as the signal is transferred therefrom and for creating a transfer potential well associated with the MOS charge transfer capacitor between each charge storage means between which the signal is to be transferred.

2. The scrollable spatial light modulator claimed in claim 1 wherein the potential well associated with each second storage means is deeper when created than the potential well associated with each first storage means when created.

3. The scrollable spatial light modulator claimed in claim 2 wherein each transfer potential well when created is smaller than the potential wells when created associated with the first and second storage means.

4. The scrollable spatial light modulator claimed in claim 1 wherein the means for non-destructively optically modulating each pixel further comprises:
reset means associated with each second storage means for causing a variable associated with the second storage means to vary in response to the signal being transferred thereto while said signal is being transferred thereto; and
means for optically modulating the pixel associated with each second storage means in response to the variable associated therewith after said signal has been transferred thereto.

5. The scrollable spatial light modulator claimed in claim 1 wherein the means for non-destructively optically modulating each pixel further comprises:
MOS transistor means interconnected between the clock means and each second storage means;
reset means for controlling the MOS transistor means to allow the voltage of each second storage means to vary in response to a signal being transferred thereto while said signal is being transferred thereto; and
means for optically modulating each pixel in response to the voltage of each second storage means.

6. A scrollable spatial light modulator, comprising:
a matrix of light modulating pixels organized in rows and columns;
a charge signal associated with the first pixel in each row to be scrolled along that row;
first and second MOS charge storage, and first and second MOS charge transfer, capacitors associated with each pixel;
means for simultaneously, non-destructively transferring the charge signals from the first charge storage capacitor of each pixel in a first column to the second charge storage capacitor of that pixel via one of the charge transfer capacitors in that pixel and then to the first charge storage capacitor of a pixel in the same row in an adjacent column via another charge transfer capacitor; and
means for non-destructively optically modulating each pixel in accordance with the charge signal stored in the second storage capacitor associated with that pixel.

7. The scrollable spatial light modulator claimed in claim 6 in which the means for non-destructively optically modulating each pixel in accordance with the charge signal stored in the second charge storage capacitor associated with that pixel, further comprises:
an MOS transistor associated with the second charge storage capacitor of each pixel;
means for permitting a signal associated with each MOS transistor to vary while a charge signal is being transferred to the associated second charge storage capacitor; and
means for modulating each pixel in accordance with the signal associated with the corresponding transistor.

8. The scrollable spatial light modulator claimed in claim 7, wherein the means for simultaneously, non-destructively transferring the charge signals further comprises:
clock means for creating a storage potential well associated with each storage capacitor before a charge signal is transferred thereto, for collapsing the storage potential well associated with each storage capacitor as the charge signal is transferred therefrom and for creating a transfer potential well associated with the MOS charge transfer capacitor when the charge signal is being transferred thereby.

9. The scrollable spatial light modulator claimed in claim 8, wherein the potential well associated with each second storage means is deeper when created than the potential well associated with each first storage means when created.

10. The scrollable spatial light modulator claimed in claim 9 wherein each transfer potential well when created is smaller than the potential wells when created associated with the first and second storage means, 11. An analog spatial light modulator, comprising:
a array of light modulating pixels in at least a row in which each pixel is adjacent the next;
means for delivering an analog signal to be scrolled along said array of pixels;
first storage means associated with each pixel;
second storage means associated with each pixel;
a display element associated with each pixel and having an analog gray scale output connected to said second storage element;
means for non-destructively transferring the signal from the first storage means of one pixel to the second storage manges of the same pixel;
means for non-destructively modulating the display element in accordance with the signal storage in the second storage means associated with that pixel; and
means for non-destructively transferring the signal from the second storage means of one pixel to the first storage means of the next adjacent pixel.

12. The spatial light modulator of claim 11 further in which
each said storage and said transfer means comprises an MOS capacitor; and further in which
said means for modulating said display element includes a switching transistor connected between the charge storage capacitor of said second storage means and said display element, and further including
clock means for creating a potential well associated with each MOS capacitor of each pixel; and
clock means for driving/switching each said transistor on or off.

13. The analog scrollable spatial light modulator claimed in claim 11, wherein each storage means and each means for transferring comprises:
an Mos capacitor.

* * * * *